United States Patent [19]

O'Mahony

[11] Patent Number: 5,015,964

[45] Date of Patent: May 14, 1991

[54] OPTICAL AMPLIFIERS

[75] Inventor: Michael J. O'Mahony, Colchester, England

[73] Assignee: British Telecommunications Public Limited Company, London, England

[21] Appl. No.: 494,835

[22] Filed: Mar. 16, 1990

Related U.S. Application Data

[63] Continuation of Ser. No. 361,803, May 31, 1989, abandoned, which is a continuation of Ser. No. 138,378, filed as PCTGB 87/00298 on May 8, 1987, published as WO87/07091 on Nov. 19, 1987, abandoned.

[30] Foreign Application Priority Data

May 6, 1986 [GB] United Kingdom ................ 8611241

[51] Int. Cl.$^5$ ............................ H01S 3/19; H01S 3/23
[52] U.S. Cl. ...................................... 330/4.3; 372/48; 372/49
[58] Field of Search ................. 372/48.49; 330/4.3

[56] References Cited

U.S. PATENT DOCUMENTS

| 3,365,671 | 1/1968 | Kogelnik | 330/4.3 |
| 3,943,462 | 3/1976 | Thompson | 372/49 |
| 4,270,834 | 1/1988 | Yamamoto et al. | 372/49 |
| 4,731,792 | 3/1988 | Shimizu et al. | 372/49 |
| 4,789,881 | 12/1988 | Alphonse | 330/4.3 |
| 4,896,195 | 1/1990 | Larsen et al. | 330/4.3 |

FOREIGN PATENT DOCUMENTS

| 0162660 | 11/1985 | European Pat. Off. | 372/49 |
| 0170313 | 2/1986 | European Pat. Off. | |
| 0174729 | 3/1986 | European Pat. Off. | |
| 2033648 | 5/1990 | United Kingdom | |

OTHER PUBLICATIONS

British Telecom Technology Journal, vol. 4, No. 2, Apr. 1986.
100C-BCOC 1985 Venice, "Semiconductor Laser Amplifiers as Repeaters".
Electronics Letters 3 Jan. 1985, vol. 21, No. 1, pp. 33-35.
Electronics Letters 23 May 1985, vol. 21, No. 11, pp. 501-502.
British Telecom Technology Journal, vol. 3, No. 3, Jul. 1985.
Third International COnference on Telecommunication Transmission London, 99 159-161.
Mukai et al., "S/N and Error Rate Performance in AlGaAs Semiconductor Laser Preamplifier and Linear Repeater Systems", *IEEE Journal of Quantum Electronics*, vol. QE-18, No. 10, 9 pp., Oct. 1982.
Ikeda, "Switching Characteristics of Laser Diode Switch", *IEEE Journal of Quantum Electronics*, vol. QE-19, No. 2, 8 pp., Feb. 1983.
Fye, Donald M., "Practical Limitations on Optical Amplifier Performance", *Journal of Lightwave Technology*, vol. LT-2, No. 4, New York, USA, Aug. 1984.
Mukai et al., "Gain, Frequency Bandwidth, and Saturation Output Power of AlGaAs DH Laser Amplifiers", *IEEE Journal of Quantum Electronics*, vol. QE-17, No. 6, Jun. 1981;
Eisenstein, G. et al., "Gain Measurements of InGaAsP 1.5 $\mu$m Optical Amplifiers," *Electronic Letters*, vol. 21, No. 23, 7 Nov. 1985.
Westlake, H. J. et al., "Measurement of Optical Bistability in an InGaAsP Laser Amplifier at 1.5 $\mu$m," *Electronics Letters*, vol. 21, No. 21, 10 Oct. 1985.

*Primary Examiner*—Nelson Moskowitz
*Attorney, Agent, or Firm*—Nixon & Vanderhye P.C.

[57] ABSTRACT

A semiconductor travelling wave optical amplifier in presented in a new configuration. An amplifier chip (20) has the rear facet (23) provided with a reflective coating. Optical signals are input and amplified signals are output via optical fibers (21, 35, 30) and directional coupler (24). A single fiber-to-amplifier alignment is required between fibre tail (25) and the front facet (22) is provided with a very low reflectivity coating. In this configuration the amplification is increased in comparison with the conventional in-line amplifier configuration.

20 Claims, 1 Drawing Sheet

OPTICAL AMPLIFIERS

This is a continuation-in-part of application Ser. No. 07/361,803, filed 31 May 1989, which is a continuation of application Ser. No. 07/138,378, filed 4 January 1988, both now abandoned.

The present invention relates to optical amplifiers and to optical amplifier assemblies.

Optical amplifiers are used to amplify light, typically in the wavelength range 0.9 to 1.7 micrometers, and especially at approximately 1.3 and 1.55 micrometers.

Generally speaking, such amplifiers comprise semiconductor laser structures operated below the lasing threshold.

Optical amplifiers, or semiconductor laser amplifiers, are of particular interest at present because of their usefulness in fibre optic communications systems, particularly as optical preamplifiers or linear repeaters.

Any given optical amplifier can generally be classified as a Fabry-Perot (FP) amplifier, which is an injection laser driven at a current I just below the lasing threshold, or a travelling wave (TW) amplifier which is an injection laser with facet reflectivities which are, in theory, zero (or, in practice, very low). TW amplifiers are sometimes referred to as near-TW amplifiers, because in practice the facet reflectivities are around $10^{-2}$ to $10^{-3}$.

The gain spectra for the two types of laser are quite different, the bandwidth of a TW amplifier being significantly greater than that of an FP amplifier. The term TW amplifier is used herein to refer to an optical amplifier which, when operated with a suitable bias, has a relatively smooth gain spectrum varying, over wavelengths of interest, by no more than 10dB and, usually, having no more than a 3dB ripple. Low facet reflectivities are one factor which lead to a smooth gain spectrum (wide bandwidth) and good gain; typically the product of the facet reflectivities is $10^{-4}$ or less.

Conventionally, an optical signal to be amplified is injected into one facet of a TW amplifier from an input optical fibre. The signal is amplified on propagation through the body of the amplifier and the amplified signal is then coupled from the opposite facet into an output optical fibre.

Accurate alignment of the ends of the optical fibres with the respective active areas of the amplifier facets is crucial to minimise signal losses. This alignment presents well-known practical difficulties in the construction of amplifier assemblies. Commonly, the alignment is achieved by operating the amplifier as a light source (i.e. increasing the bias current above the threshold value) and manipulating the optical fibre so as to maximise the optical power coupled into the fibre. The optical fibre, usually mounted on a suitable carrier, may then be soldered or otherwise fixed in place. For an efficient optical coupling the alignment tolerance for the relative positioning of a single-mode optical fibre and the active area of the amplifier may be within ±0.5 micrometers, or even ±0.2 micrometers.

It is an aim of the invention to provide an amplifier which has enhanced performance, particularly gain, over conventionally configured optical amplifiers.

Additionally or alternatively, it is an object of the present invention to provide an amplifier assembly which can ease the alignment problems associated with the construction of conventional laser amplifier assemblies.

According to the present invention an optical amplifier has first and second opposite facets provided with signal reflection means having, respectively, low and high reflectivities $R_1$, $R_2$, wherein the product $R_1 R_2$ is of the order of $10^{-4}$ or less and $R_2$ is in the range of 0.3 to 1.0.

Preferably, the amplifier is adapted so that in use an optical signal enters via the first facet, is amplified on a first traverse of the amplifier, and reflected at the high reflectivity means to return along substantially the same path as that of the first traverse so as to exit through the first facet at substantially the point of entry.

The amplifier, ideally a TW amplifier, has $R_1$ as low as possible: preferably less than $5 \times 10^{-4}$, and more preferably $10^{-5}$ or even less. $R_2$ on the other hand is relatively high, typically in the range 0.5 to 1.0 and ideally between 0.85 and 1.00. The product $R_1 R_2$ may be $10^{-4}$ or less, and preferably around $10^{-6}$ or less. $R_1/R_2$ may be around $10^{-3}$ or $10^{-4}$ and preferably around $10^{-5}$ or $10^{-6}$, or less.

The invention also provides an optical amplifier assembly comprising an optical amplifier and an optical waveguide located to transmit an input optical signal via the active area of the first facet, and to receive an amplified output signal.

Means such as a directional coupler, for example an X- or Y-coupler, may be provided to separate the output signal from the input signal.

Conveniently, the waveguide is a single mode fibre. It will be appreciated, however, that the optical waveguide may alternatively be a planar device, such as, for example, a lithium niobate waveguide device.

The very low reflectivity means is most conveniently provided by ensuring that the first facet has low reflectivity—for example by evaporation of an anti-reflection coating of suitable thickness and material. Skilled persons will already be familiar with appropriate techniques and materials, and information is also available in published literature. Materials currently used to provide low reflectivities (to $10^{-4}$ and below) are $ZrO_2$ and $ZrTiO_4$, and these can be refractive index-matched to the amplifier material, and evaporated to a suitable coating thickness (approximately $\lambda/4$).

The high reflectivity signal reflection means may be conveniently provided by deposition of a suitably reflective surface on the second facet. Aluminum or chromium on gold deposits are examples.

It will be observed that the preferred configuration of an optical amplifier assembly according to the present invention has the advantage that the gain is significantly higher than with conventional optical amplifiers. Also, only a single precision alignment of an optical fibre with the active area of a semiconductor optical amplifier is required.

European Patent Publication No. 0170313 A discloses a semiconductor laser device which may be used as an amplifier. The device is of the Fabry-Perot type, so both facet reflectivities will be high. The document refers to the difficulty of coupling single-mode fibres to the front and rear of a semi-conductor laser, and proposes halving the alignment steps by coupling fused input and output fibres to the same radiation-emitting surface of the laser. It is pointed out that the laser structure is symmetrical and it does not, in fact, have a front or a rear, so it does not matter which facet the fibres are aligned with.

Another application, UK Patent Application GB 2033648 A, discloses a special kind of optical amplifier, where light enters the semiconductor device through a low reflectivity film on a facet of the device, and is transmitted along a groove of high refractive index material, which follows a zig-zag path between the facets of the device, before emission through a second low reflectivity film on the opposite facet. Reflection within the device may be effected at a reflective film, or by total internal reflection. Light both enters and leaves the device through a low reflectivity surface as in a standard optical amplifier; the gain is increased by the series of internal reflections.

The invention will now be described in detail by way of example with reference to the accompanying drawings in which.

Figure 1:
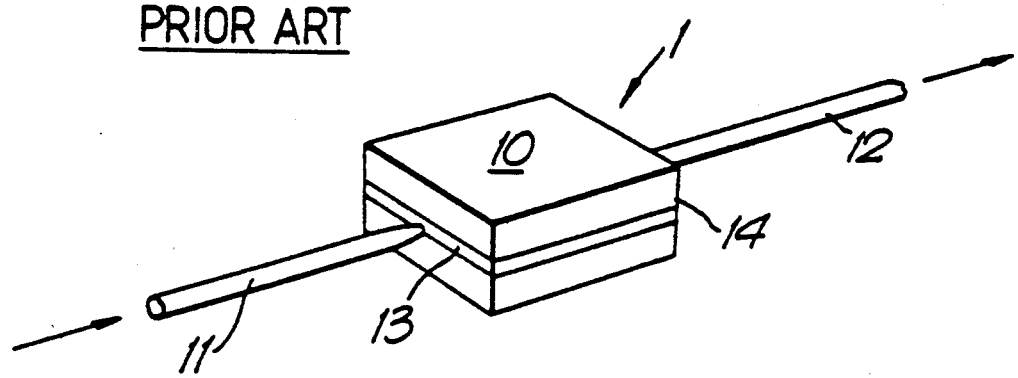
FIG. 1 is a representation of a prior art amplifier configuration.

Referring first to FIG. 1, a conventional travelling wave optical amplifier device 1 comprises an amplifier chip 10 with an input optical fibre 11 and an output optical fibre 12, each aligned with the active areas of amplifier facets 13 and 14 respectively. In order to obtain a wide optical bandwidth (i.e. a low ripple of around 3dB across the pass band), both the facets 13 and 14 are provided with anti-reflection coatings having reflectivities of around $10^{-2}$–$10^{-3}$.

Figure 2:
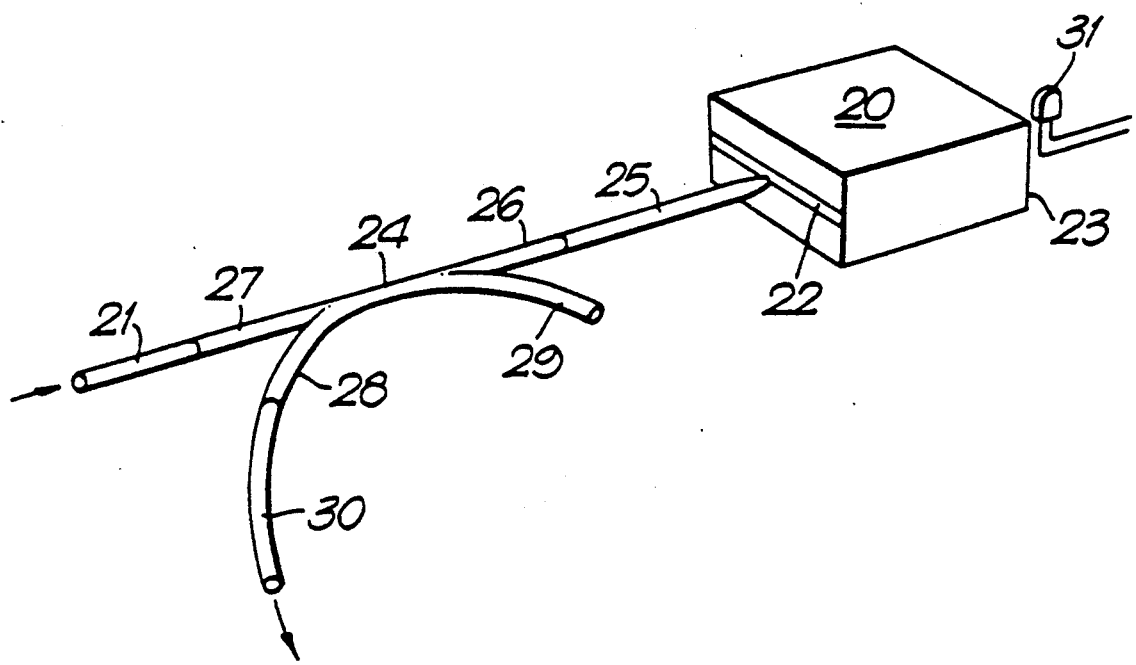
FIG. 2 is a schematic illustration of an embodiment according to the present invention.

A TW optical amplifier according to the present invention is illustrated schematically in FIG. 2. An amplifier chip 20 has facets 22 and 23. Facet 22 has a low-reflectivity coating having reflectivity around $10^{-4}$ or less, which is much lower than the standard reflectivities of TW optical amplifiers. The low reflectivity surface consists of an evaporated film of $ZrO_2$ or $ZrTiO_4$. The lower the reflectivity, the better the performance, so improvements in low-reflectivity coatings will lead to increased gain.

In contrast to the conventional assembly of FIG. 1, facet 23 is provided with a high reflectivity coating. Aluminum or gold deposits are suitable for such coating, with reflectivities greater than 95% being routinely obtainable. Typically the reflectivity may be 95% or 99% or higher. When a metallic reflective coating is employed it is electrically isolated from the body of the amplifier using an appropriate intermediate isolating layer.

The amplifier assembly further comprises an optical fibre tail 25 which is aligned at one end (shown tapered) with the first facet 22 of the amplifier 20 and is spliced at the opposite end to a leg 26 of directional coupler 24. Optical fibres 21 and 30 are spliced to the ends 27 and 28 respectively of directional coupler 24.

In operation, input optical signals pass from the fibre 21 via the coupler 24 and fibre tail 25 into the amplifier 20. The signals are amplified on a first traverse of the amplifier 20, are then reflected back from facet 23, and are further amplified on a second traverse of amplifier 20 before being recoupled into fibre tail 25.

The amplified output signals are separated by the directional coupler 24 and exit via a leg 28 of the coupler into the output fibre 30.

The directional coupler 24 is illustrated as an X-coupler. The leg 29 of the directional coupler 24 may be utilised, for example, for such purposes as monitoring the input signal or for passing a proportion of the input signal to a second amplifier.

For the conventional amplifier configuration of FIG. 1, with a 3dB ripple across the pass band, the peak gain, $G_1$ is approximated by $$G_1 = 1.45 G_S (1 - R_1)(1 - R_2)$$

where $R_1$ and $R_2$ are the respective (low) reflectivities of facets 13 and 14, $G_s$ is the gain from a single pass through the amplifier. It can also be shown that $G_s$ may be approximated as $$G_s = 0.17/(R_1 R_2)^{0.5}$$

Taking $R_1 = R_2 = 0.01$, for example, this gives $$G_1 = 24.75 \text{ (or } 13.9 dB)$$

This figure does not include coupling losses to and from the amplifier, which may be 5 or 6dB per facet.

For the amplifier configuration of FIG. 2, the peak gain, $G_2$, is given approximately by $$G_2 = 1.45 R_4 G_s^2$$

where $R_4$ is the (high) reflectivity of facet 23. For the purposes of this comparison, we add the constraint $R_3 R_4 = R_1 R_2$, where $R_3$ is the (low reflectivity of facet 22 (which is much lower than the reflectivities of conventional amplifiers); so that $G_s$ is the same as before. Taking $R_4 = 0.9$, for example, then $R_3 = 1.1 \times 10^{-4}$ (both achievable reflectivities), which gives $$G_2 = 363.6 \text{ (or } 25.6 dB)$$

Thus, in this example, even allowing for a 6dB loss associated with the need for a coupler, there is a net improvement in gain (25.6−6−13.9 = 5.7dB) in using the reflective amplifier configuration of FIG. 2 rather than the transmissive configuration of FIG. 1.

If it were attempted to convert the conventional amplifier configuration of FIG. 1 to that of FIG. 2 by coupling an output fibre to input fibre 11, and increasing the reflectivity of facet 14, but without reducing the reflectivity of the input facet, then $G_s = 1.3$ for $R_2 = 0.9$ for facet 14. It follows that the gain of this amplifier is $G_1 = 1.45 R_2 G_s^2 = 4.2$ (or 6.2dB), which is much smaller than the gain $G_1 = 24.75$ of the amplifier before modification. The reflectivity values given in this example for high and low reflectivity surfaces of 0.9 and 0.01 respectively are of the same order as those currently used in practice for such surfaces.

The low reflectivity of facet 22 is therefore of considerable importance for increased gain. A reduced reflectivity of $10^{-3}$ (compared with a typical conventional reflectivity of around $10^{-2}$) gives $G_s = 5.7$ and an amplifier gain of 42 (or 16.2dB).

It will be apparent from the preceding analysis that performance of a semiconductor optical amplifier in the reflective configuration improves the lower the reflectivity of the first facet and the higher the reflectivity of the second facet. However, in selecting specific values for the low and high relative reflectivities for an amplifier assembly as described above the skilled person will have regard to those constraints appropriate to the situation, such as, for example, desired performance (e.g. gain, bandwidth, etc.) versus production costs.

As mentioned previously, the cleaved end faces of a semiconductor laser amplifier have a raw uncoated reflectivity of approximately 32% (i.e. 0.32). So-called anti-reflection coatings are used to produce relatively lower reflectivities. Reflectivities below 3% (i.e. 0.03) are commonly achievable, and even two orders of magnitude below that (a reflectivity of $10^{-4}$) is now achievable. A relatively high reflectivity for the second facet is obtainable, for example, by deposition or direct attachment of a mirrored surface. Alternatively, a high reflectivity surface may be positioned adjacent the relevant facet. Reflectivities above 70% (0.7) are easily obtained and figures above 95% (0.95) have also been routinely achieved.

As can be seen from the above analysis, the two facets typically have reflectivities two or more orders of magnitude different from one another, and ideally three or four orders of magnitude different.

The products of the reflectivities are of the order of $10^{-4}$ or less, and preferably below $10^{-6}$.

The advantages of the reflective amplifier configuration of the above embodiment include:

1. Requirement for only a single fibre to laser coupling-compatible with standard laser packaging.
2. Additional gain owing to additional amplification path and facet reflectivities.
3. Convenient points provided for monitoring the input and amplified signals.

I claim:

1. An optical amplifier comprising a medium capable of providing optical amplification by laser action, the amplifier being provided with a single optical cavity within which said medium is confined, the optical cavity comprising first and second opposed signal reflection means having respectively, low and high reflectivities $R_1$ and $R_2$, wherein the product $R_1R_2$ is less than $5 \times 10^{-4}$ and $R_2$ is in the range 0.3 to 1.0.

2. An optical amplifier as claimed in claim 1 adapted so that in use an optical signal which enters via the first reflection means is amplified on a first traverse of the amplifier, reflected at said second reflection means and returned along substantially the same path as that of the first traverse so as to exit through the first reflection means at substantially the point of entry.

3. An optical amplifier as claimed in claim 1 or claim 2, wherein the amplifier is a travelling wave amplifier.

4. An optical amplifier as claimed in 1 or 2, wherein $R_1$ is less than $10^{-3}$.

5. An optical amplifier as claimed in claim 4, wherein $R_1$ is less than $10^{-4}$.

6. An optical amplifier as claimed in claim 1 or 2, wherein $R_2$ is in the range 0.85 to 1.00.

7. An optical amplifier as claimed in any one of 1 or 2, wherein the product of $R_1R_2$ and $R_1/R_2$ is of the order of $10^{-6}$ or less.

8. An optical amplifier as claimed in 1 or 2 wherein said low and high reflectivity reflection means are provided by, respectively, low and high reflectivity facets of said laser amplifier.

9. An optical amplifier assembly comprising an amplifier as claim in claim 8 and an optical waveguide located to transmit an input optical signal via the active area of one of said low and high reflectivity facet, and to receive an amplified output signal.

10. An optical amplifier assembly as claimed in claim 9, including a directional coupler, one arm of which is associated with said waveguide, arranged to separate the output signal from the input signal.

11. An optical amplifier assembly according to claim 9 or claim 10, including amplifier control means comprising a controller and a detector positioned to detect a proportion of the amplified optical signal transmitted by the high reflectivity means and adapted to provide a monitor signal to the controller for controlling the amplifier gain.

12. An optical amplifier assembly comprising:

an amplifier which comprises:
   a medium capable of providing optical amplification by laser action, first and second opposed facets defining the extent of said medium, and
   an optical cavity within which said medium is confined, the optical cavity comprising first and second opposed signal reflection means having respectively low and high reflectivities $R_1$ and $R_2$, the product $R_1R_2$ being less than $5 \times 10^{-4}$ and $R_2$ being in the range 0.5 to 1.0, wherein said first facet defines said first signal reflection means and said second facet is positioned between said first facet and said second signal reflection means in an optical path of said optical cavity; and
signal transmission means comprising an optical waveguide aligned with said first facet for launching optical signals into said optical cavity;
whereby, in use, an input optical signal transmitted via said optical waveguide is amplified on a first traverse of the amplifier, is reflected by said second signal refection means, and is further amplified by a second traverse of said amplifier and the further amplified signal is subsequently coupled into said signal transmission means as an output signal.

13. An optical amplifier assembly according to claim 12, including amplifier control means comprising a controller and a detector positioned to detect a proportion of the amplified optical signal transmitted by the high reflectivity means and adapted to provide a monitor signal to the controller for controlling the amplifier gain.

14. A travelling wave optical amplifier comprising:
a first optical signal reflector having a low reflectivity $R_1$;
a second optical signal reflector having a high reflectivity $R_2$ in the range of 0.5 to 1.0, the product $R_1R_2$ being less than on the order of $5 \times 10^{-4}$, an optical path defined between said first and second optical signal reflectors, said second optical signal reflector reflecting optical signals incident thereon back along said optical path;
an optical waveguide optically coupled to said first optical signal reflector for applying input optical signals along said optical path; and
an optical amplifier medium, disposed between and optically coupled to said first and second optical signal reflectors along said optical path and having first and further ends, said optical amplifier medium defining at said first end thereof a first facet providing said first optical signal reflector and defining at said further end thereof a second facet optically coupled to said second reflector and disposed along said path between said first facet and said second reflector, said optical amplifier medium amplifying said input optical signals along a first traverse along said optical path, further amplifying optical signals reflected along said optical path by said second optical signal reflector, and coupling said further-amplified signals into said optical waveguide as output signals.

15. Within a travelling wave optical amplifier of the type including an optical amplifier medium, a method of amplifying optical signals including the following steps:
  (a) coupling input optical signals into an optical cavity defining an optical path via a first optical signal reflector having a low reflectivity $R_1$;
  (b) propagating said input optical signals in a first direction along said optical path;
  (c) amplifying said input optical signals with said optical amplifier medium as said signals propagate along said optical path in said first direction;
  (d) reflecting said optical signals back along said optical path in a second direction opposite said first direction with a second optical signal reflector, said second optical signal reflector having a high reflectivity $R_2$ in the range of 0.5 to 1.0, the product $R_1 \times R_2$ being less than on the order of $5 \times 10^{-4}$; and
  (e) coupling said signals reflected by said reflecting step (d) back along said optical path out of said optical cavity through said first optical signal reflector.

16. An arrangement comprising:
  an optical waveguide carrying input and output optical signals; and
  an optical amplifier comprising a medium capable of providing optical amplification by laser action, the amplifier being provided with a single optical cavity within which said medium is confined, the optical cavity comprising first and second opposed signal refection means having respectively, low and high reflectivities $R_1$ and $R_2$, said optical waveguide being aligned with said first signal reflection means having said low reflectivity $R_1$, said optical waveguide applying said input optical signals to said first signal refection means and receiving said output optical signals through said first signal reflection means,
  wherein the product $R_1 R_2$ is less than $5 \times 10^{-4}$ and $R_2$ is in the range 0.3 to 1.0.

17. An arrangement as in claim 16 wherein said arrangement has provision for only a single optical resonator, said signal optical resonator being defined by said first and second signal reflection means.

18. An arrangement as in claim 16 wherein said medium includes first and second facets.

19. An arrangement as in claim 18 wherein one of said first and second facets comprises said first signal reflection means.

20. An arrangement as in claim 18 wherein said first and second facets are each remote from said second signal reflection means.

* * * * *